United States Patent [19]

Okada et al.

[11] 3,876,934

[45] Apr. 8, 1975

[54] PHASE SHIFTING CIRCUIT

[75] Inventors: Takashi Okada, Kanagawa; Tsutomu Niimura, Tokyo, both of Japan

[73] Assignee: Sony Corporation, Tokyo, Japan

[22] Filed: Sept. 20, 1973

[21] Appl. No.: 399,045

[30] Foreign Application Priority Data

Sept. 22, 1972 Japan .............................. 47-95340

[52] U.S. Cl. ................ 323/119; 323/122; 328/155; 358/28

[51] Int. Cl. .......................................... G01r 25/04

[58] Field of Search ............... 178/5.4 HE; 307/262; 323/101, 108, 119, 122; 328/155; 358/28

[56] References Cited

UNITED STATES PATENTS

| | | | |
|---|---|---|---|
| 2,753,519 | 7/1956 | Fischman | 328/155 UX |
| 3,527,964 | 9/1970 | Hansen et al. | 328/155 X |

*Primary Examiner*—A. D. Pellinen

*Attorney, Agent, or Firm*—Lewis H. Eslinger; Alvin Sinderbrand

[57] ABSTRACT

In a phase shifting circuit particularly adapted to be formed as an integrated circuit, for example, for use in the chrominance channel of a color television receiver, the base-emitter resistance of a transistor and a capacitor form a series circuit receiving input signals of opposed polarity at its opposite ends, the collector-emitter path of the transistor is connected across a power supply source, and a variable constant current source is connected with the transistor's emitter for controlling the emitter current and thereby varying the emitter internal resistance so that the phase of an output signal derived from the emitter is determined by the value of the constant current transmitted through the variable constant current source. The variable constant current source may be constituted by a second transistor through the collector-emitter path of which the emitter of the first mentioned transistor is connected to the respective side of the power supply source, and a source of a variable D.C. bias current to the base of the second transistor.

10 Claims, 7 Drawing Figures

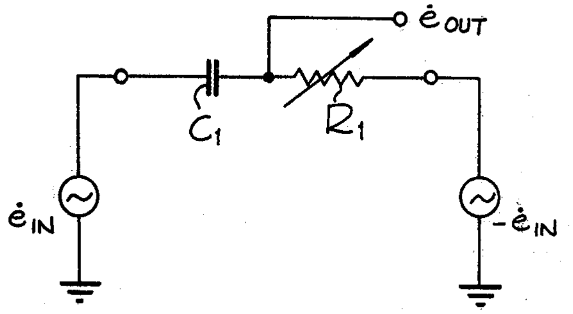
FIG. 1 PRIOR ART
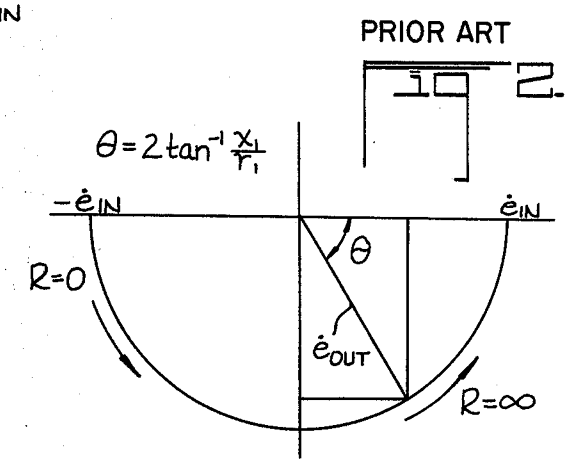
PRIOR ART FIG. 2
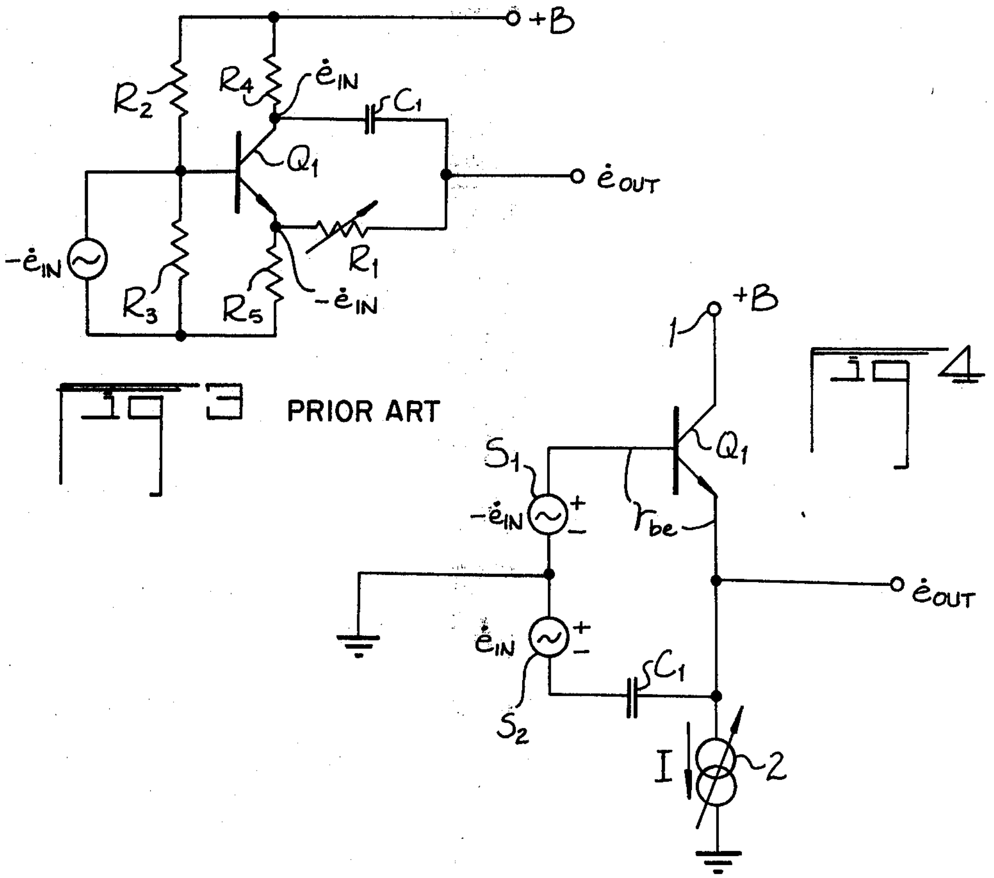
FIG. 3 PRIOR ART, FIG. 4

PHASE SHIFTING CIRCUIT

BACKGROUND OF THE INVENTION

1. Field of the Invention

This invention relates generally to phase shifting circuits, and more particularly is directed to an improved phase shifting circuit that is adapted to be conveniently and economically formed as an integrated circuit.

2. Description of the Prior Art

Phase shifting circuits utilizing a series connected resistor-capacitor (R-C) network have been widely used because of the simplicity thereof, and several circuit configurations have been proposed for such circuits. In a typical phase shifting circuit of the described type, an input signal is supplied to the base electrode of a transistor functioning as a signal inverter to provide such input signal and an input signal of opposite polarity at the emitter and collector electrodes respectively, of the transistor, the series circuit of a capacitor and a variable resistor is connected between the collector and emitter electrodes, and the output signal is derived at a junction between capacitor and variable resistor, with the phase of the output signal relative to the input signal being determined by the resistance value of the variable resistor.

When the known phase shifting circuit, as described above, is made in the form of an integrated circuit, the variable resistor, which may be constituted by a manually controllable potentiometer, has to be embodied in an external circuit which is connected through lead wires to two terminals provided on the integrated circuit. If the lead wires are long, they may pick up radiated noise signals from other adjacent circuits, particularly, if the phase shifting circuit is part of a television receiver. On the other hand, if the lead wires are shielded to prevent the pickup of noise signals, the shielding tends to reduce the level of the signal passing through the variable resistor. Further, since the signal current passes through the variable resistor in the phase shifting circuit of the described type, the variable resistor cannot be simply replaced by a transistor arranged to carry the signal current in its collector-emitter path with the resistance to such flow being varied by controlling the base bias of the transistor. Although the transistor replacing the variable resistor can be made part of the integrated circuit and its base bias can be varied by a direct current control which requires only a single terminal on the integrated circuit for connection thereto, the transistor in the above described arrangement has a reactance component as well as a resistance component that affects the signal current and may distort the obtained phase shifted output signal.

SUMMARY OF THE INVENTION

Accordingly, it is an object of the invention to provide an improved phase shifting circuit which avoids the above disadvantages of the described known circuit.

More specifically, it is an object of the invention to provide an improved phase shifting circuit which is simple in construction and particularly adapted to be formed as an integrated circuit.

Another object is to provide a phase shifting circuit, as aforesaid, in which a manually actuable direct current control is provided for varying the phase of the output signal relative to the input signal, and such control can be connected to a single terminal provided on an integrated circuit that includes all of the other components of the phase shifting circuit.

In accordance with an aspect of the invention, the base-emitter resistance of a transistor and a capacitor form a series circuit receiving input signals of opposed polarity at its opposite ends, the collector-emitter path of the transistor is connected across a power supply source, and a variable constant current source controls the emitter current of the transistor and thereby varies the emitter internal resistance so that the phase of the output signal derived from the emitter is determined by the value of the constant current transmitted by the variable constant current source.

In a preferred embodiment, the emitter of the transistor is connected to the respective side of the power supply source through the collector-emitter path of a second transistor which has a source of a variable D.C. bias current connected to its base for constituting the variable constant current source.

The above, and other objects, features and advantages of the invention, will be apparent in the following detailed description of an illustrative embodiment which is to be read in connection with the accompanying drawings.

BRIEF DESCRIPTION OF THE DRAWINGS

FIG. 1 is a schematic diagram illustrating generally how phase shifting can be achieved with an R-C series network or circuit according to the prior art;

FIG. 2 is a graphical representation showing the shift of the phase of the output signal in respect to the input signal in response to variation of the resistance value in the circuit of FIG. 1;

FIG. 3 is a schematic diagram of a particular phase shifting circuit according to the prior art which includes an R-C series circuit as in FIG. 1;

FIG. 4 is a schematic diagram similar to that of FIG. 1, but showing an improved phase shifting circuit according to the present invention;

DESCRIPTION OF THE PREFERRED EMBODIMENT

Figure 5:
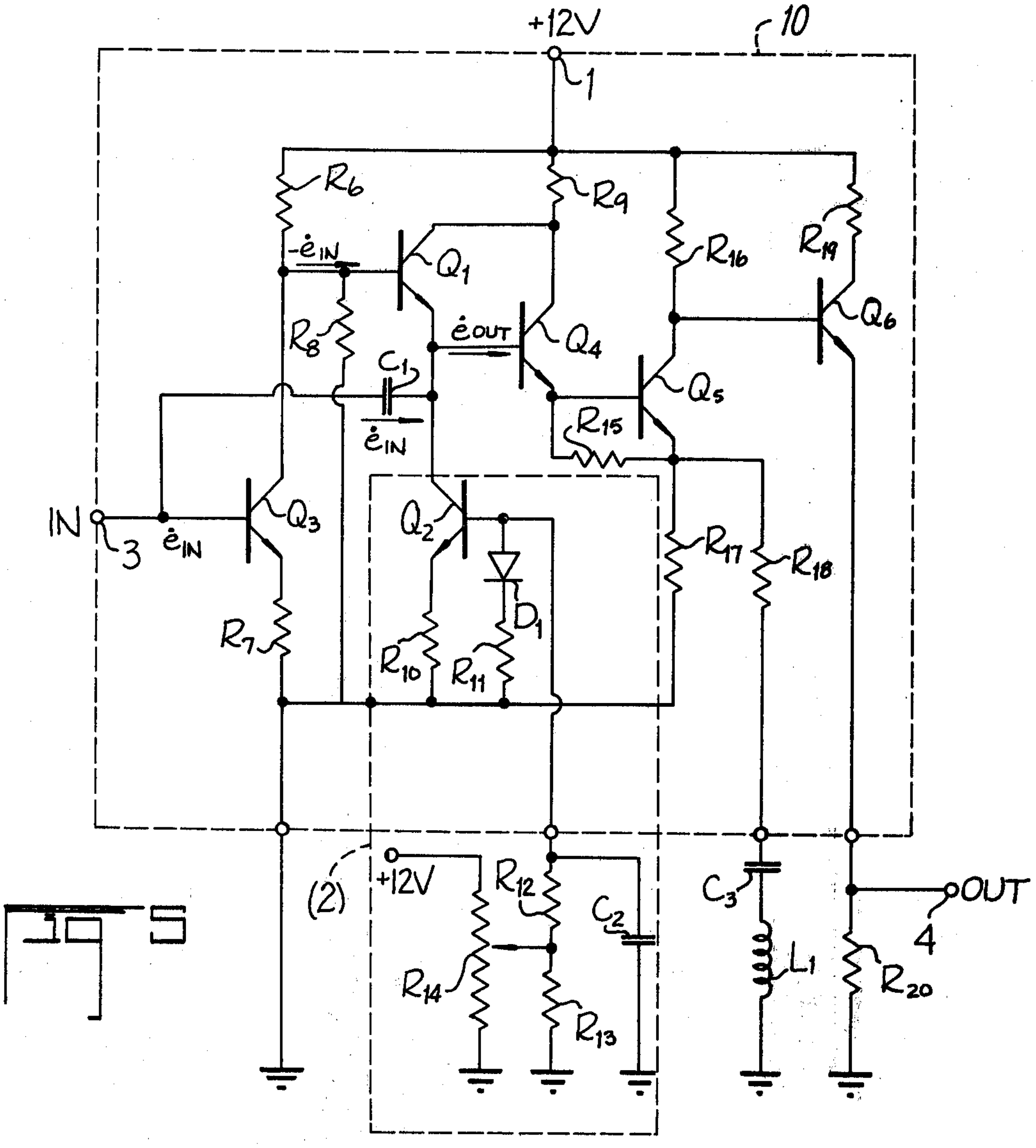
FIG. 5 is a schematic diagram showing details of a phase shifting circuit according to the present invention.

Before proceeding to a description of the phase shifting circuit according to this invention, and in order to provide an improved understanding of the invention, reference will be made to FIG. 1 which generally illustrates the major components of a circuit according to the prior art. As shown, such circuit generally comprises a capacitor $C_1$ and a variable resistor $R_1$ connected to form a series circuit receiving input signals $\dot{e}_{in}$ and $-\dot{e}_{in}$ of opposed polarity at its opposite ends, respectively, and with the output signal $\dot{e}_{out}$ being derived at a junction between the capacitor $C_1$ and resistor $R_1$. With the circuit of FIG. 1, the output voltage $\dot{e}_{out}$ may be expressed as follows:

$$\dot{e}_{out} = \dot{e}_{in} - \frac{2\dot{e}_{in}}{r_1 - jx_1} \cdot (-jx_1) = \dot{e}_{in} \cdot \frac{(r_1 + jx_1)^2}{r_1^2 + x_1^2} = \dot{e}_{in} \angle 2\tan^{-1} \frac{x_1}{r_1} \quad (I)$$

in which, $r_1$ is the resistance value of resistor $R_1$, and $x_1$ is the reactance value of capacitor $C_1$.

From equation (I) above, it will be apparent that the R-C series circuit shifts the phase of the input signal so that the obtained output signal has its phase shifted by the angle $\theta = 2\tan^{-1}(x_1)/r_1$ relative to the phase of the input signal $\dot{e}_{in}$. As shown on FIG. 2, when the resistance value $r_1$ of the variable resistor $R_1$ is varied from 0 to infinity, the vector representing the phase of output signal $\dot{e}_{out}$ is displaced angularly between a position shifted 180° in respect to input signal $\dot{e}_{in}$ and a position in phase with such input signal.

Referring now to FIG. 3, in which a practical circuit configuration of the prior art employing the phenomenom described with reference to FIGS. 1 and 2 is illustrated, it will be seen that such circuit includes biasing resistors $R_2$ and $R_3$ for a transistor $Q_1$ which has an input signal $-\dot{e}_{in}$ applied to its base electrode. The collector and emitter electrodes of transistor $Q_1$ are connected through collector and emitter resistors $R_3$ and $R_4$ to the opposite sides of a power supply source, and the capacitor $C_1$ and variable resistor $R_1$ form an R-C series network or circuit connected between the collector and emitter electrodes, with the output signal $\dot{e}_{out}$ being derived from a junction between capacitor $C_1$ and variable resistor $R_1$. In the circuit of FIG. 3, the resistance values of resistors $R_4$ and $R_5$ are selected to be approximately equal to each other so that the alternating components of the collector and emitter voltages form the input signals $\dot{e}_{in}$ and $-\dot{e}_{in}$ of opposed polarity for the R-C series network. Therefore, the circuit of FIG. 3 operates as a phase shifting circuit in the manner explained above with reference to FIGS. 1 and 2. Of course, the shifting of the phase of the output signal relative to the input signal is controlled by varying the resistance value of the variable resistor $R_1$.

However, when the known phase shift circuit of FIG. 3 is produced in the form of an integrated circuit, the variable resistor $R_1$, which may be constituted by a manually controllable potentiometer, has to be provided externally of the integrated circuit and connected on two terminals on the latter by way of lead wires. If the lead wires are long, as may be necessary to permit convenient manual control of the potentiometer or variable resistor, the lead wires may pick up radiated noise signals from other circuits, particularly if the phase shifting circuit is incorporated in a color television receiver. On the other hand, if the lead wires are shielded to prevent the pickup of noise signals, the shielding tends to reduce the level of the signal passing through the variable resistor $R_1$. Further, since the signal current passes through the variable resistor $R_1$ in the phase shifting circuit of the described type, that variable resistor $R_1$ cannot be simply replaced by a transistor arranged to carry the original current in its collector-emitter path with the resistance to such flow being varied by controlling a D.C. bias current applied to the base of the transistor. Although the transistor replacing the variable resistor $R_1$ can be incorporated in the integrated circuit and its base bias can be varied by an external direct current control which requires only a single terminal on the integrated circuit for its connection thereto, the transistor in the described arrangement has a reactance component as well as a resistance component that affects the signal current and may distort the phase shifted output signal that is obtained.

Referring now to FIG. 4, it will be generally seen that, in a phase shifting circuit according to this invention, the foregoing disadvantages and problems of the prior art circuits are overcome by employing, as the R-C series circuit or network, the base-emitter resistance $r_{be}$ of a transistor $Q_1$ connected in series with a capacitor $C_1$, with the input signals $-\dot{e}_{in}$ and $\dot{e}_{in}$ of opposed polarity being applied from respective sources $S_1$ and $S_2$ to the respective ends of the series circuit, that is, to the base electrode of transistor $Q_1$ and to capacitor $C_1$. Further, transistor $Q_1$ has its collector electrode connected to one voltage terminal 1 of a power supply source, while the emitter electrode of transistor $Q_1$ is connected to the other voltage terminal of the power supply source, for example, to ground, through a variable constant current source, indicated schematically at 2 on FIG. 4, for controlling the emitter current of the latter and thereby varying its emitter internal resistance $r_e$. Finally, the output signal $\dot{e}_{out}$ is derived from the emitter electrode of transistor $Q_1$.

In the above described circuit arrangement according to this invention, the emitter internal resistance $r_e$, which forms part of the base-emitter resistance $r_{be}$ of transistor $Q_1$ included in the R-C series circuit, varies in accordance with the emitter current I, which is in turn determined by the value of the constant current transmitted or passing through the variable constant current source or sink 2, as follows:

$$r_e = \frac{KT}{Q} \cdot \frac{1}{I} \quad (II)$$

in which, K is the Boltzmann constant, T is the absolute temperature and $q$ is the electron charge.

It will be apparent from equation (II) above that varying the constant current passed by source or sink 2, and hence varying the emitter current of transistor $Q_1$, varies the emitter internal resistance $r_e$ so that the base-emitter resistance $r_{be}$ of transistor $Q_1$ can be controlled by controlling the variable constant current source or sink 2. Since the variable base-emitter resistance $r_{be}$ of transistor $Q_1$ acts similarly to the variable resistor $R_1$ of the prior art circuit of FIG. 1, it will be apparent that the output signal $\dot{e}_{out}$ derived from the emitter electrode or transistor $Q_1$ in the circuit of FIG. 4 has its phase shifted relative to that of the input signal in the same manner as has been described in connection with FIGS. 1 and 2.

Referring now to FIG. 5, it will be seen that, in a phase shifting circuit according to a practical embodiment of the invention, most of the components are incorporated in an integrated circuit formed on a single semiconductor substrate or chip 10. Such components are shown to include the main transistor $Q_1$ corresponding to the transistor included in the circuit shown on FIG. 4, a transistor $Q_2$ which forms part of the variable constant current source 2, a transistor $Q_3$ functioning as a signal inverter to provide the input signal $-\dot{e}_{in}$ at its collector electrode with the polarity thereof being opposed to that of an input signal $\dot{e}_{in}$ which is applied to the base electrode of transistor $Q_3$ from an input terminal 3 which receives input signal $\dot{e}_{in}$ from a suitable source thereof, an output transistor $Q_4$ for the phase shifting circuit, a transistor $Q_5$ for amplifying the phase shifted output signal, and buffer transistor $Q_6$ interposed between the amplifying transistor $Q_5$ and an output terminal 4. Also formed on the semi-conductor chip 10 is the capacitor $C_1$ connected between input terminal 3 and the emitter electrode of transistor $Q_1$ to form the R-C series circuit with the base-emitter resistance of transistor $Q_1$ which has its base electrode connected to the collector electrode of transistor $Q_3$ so that the ends of the R-C series circuit have the input signals $\dot{e}_{in}$ and $-\dot{e}_{in}$, respectively, applied thereto. The semiconductor chip 10 is further shown to have thereon a voltage or power supply terminal 1, bias resistors $R_6$ and $R_8$ for transistor $Q_1$ connected between the base electrode of the latter and power supply terminal 1 and ground, respectively, an emitter resistor $R_7$ for the signal inverting transistor $Q_3$, a common collector resistor $R_9$ for the transistors $Q_1$ and $Q_4$, an emitter resistor $R_{10}$ for the transistor $Q_2$, a resistor $R_{11}$ and diode $D_1$ forming part of a base bias circuit for the transistor $Q_2$, bias resistors $R_{15}$ and $R_{17}$ for the amplifying transistor $Q_5$, a load resistor $R_{16}$ for transistor $Q_5$, a resistor $R_{18}$ which is connected with a capacitor $C_3$ and an inductance $L_1$ to form a wave shaping circuit which assures a sinusoidal configuration for the output signal at the collector electrode of transistor $Q_5$, and a collector resistor $R_{19}$ for the buffer transistor $Q_6$.

The variable constant current source 2 in the circuit according to this invention, as shown on FIG. 5, further includes a capacitor $C_2$ grounding the base electrode of transistor $Q_2$ in respect to alternating currents, and resistors $R_{12}$ and $R_{13}$ connected between the base electrode of transistor $Q_2$ and ground, with the junction between resistors $R_{12}$ and $R_{13}$ being connected to the movable tap of a variable resistor or potentiometer $R_{14}$ which has its resistance element connected across the power supply, as shown. It will be apparent on FIG. 5 that the resistors $R_{12}$, $R_{13}$ and $R_{14}$ and capacitor $C_2$ provided for applying a variable D.C. bias current to the base electrode of transistor $Q_2$ in the variable constant current source 2 can be connected to the semiconductor chip 10 at a single terminal on the latter. The circuit of FIG. 5 is completed by an emitter resistor $R_{20}$ for the buffer transistor $Q_6$, with the output terminal 4 being connected to a junction between resistor $R_{20}$ and the emitter electrode of transistor $Q_6$.

During operation of the phase shifting circuit of FIG. 5, the input signal $\dot{e}_{in}$ is supplied to the emitter electrode of transistor $Q_1$ through capacitor $C_1$, and the input signal $-\dot{e}_{in}$ of opposite polarity is applied from the collector electrode of transistor $Q_3$ to the base electrode of transistor $Q_1$. The emitter electrode of transistor $Q_1$ is connected to ground through the collector-emitter path of transistor $Q_2$ which has a variable D.C. bias current supplied to its base electrode by means of the resistors $R_{12}$, $R_{13}$ and $R_{14}$. When the variable resistor or potentiometer $R_{14}$ is adjusted manually, the D.C. bias current to the base electrode of transistor $Q_2$ is varied to control the collector current of transistor $Q_2$ and to correspondingly control the emitter current of transistor $Q_1$. Accordingly, the emitter internal resistance of transistor $Q_1$ is varied in response to manual adjustment of variable resistor $R_{14}$, and the output signal $\dot{e}_{out}$ applied from the emitter of transistor $Q_1$ to the base electrode of transistor $Q_4$ has its phase shifted in respect to the input signal $\dot{e}_{in}$ by an angle dependent on the setting of resistor $R_{14}$. Such output signal is amplified and shaped by transistors $Q_4$, $Q_5$ and $Q_6$ so that an amplified phase shifted output signal in the form of a sinusoidal wave is obtained at output terminal 4.

Figure 6:
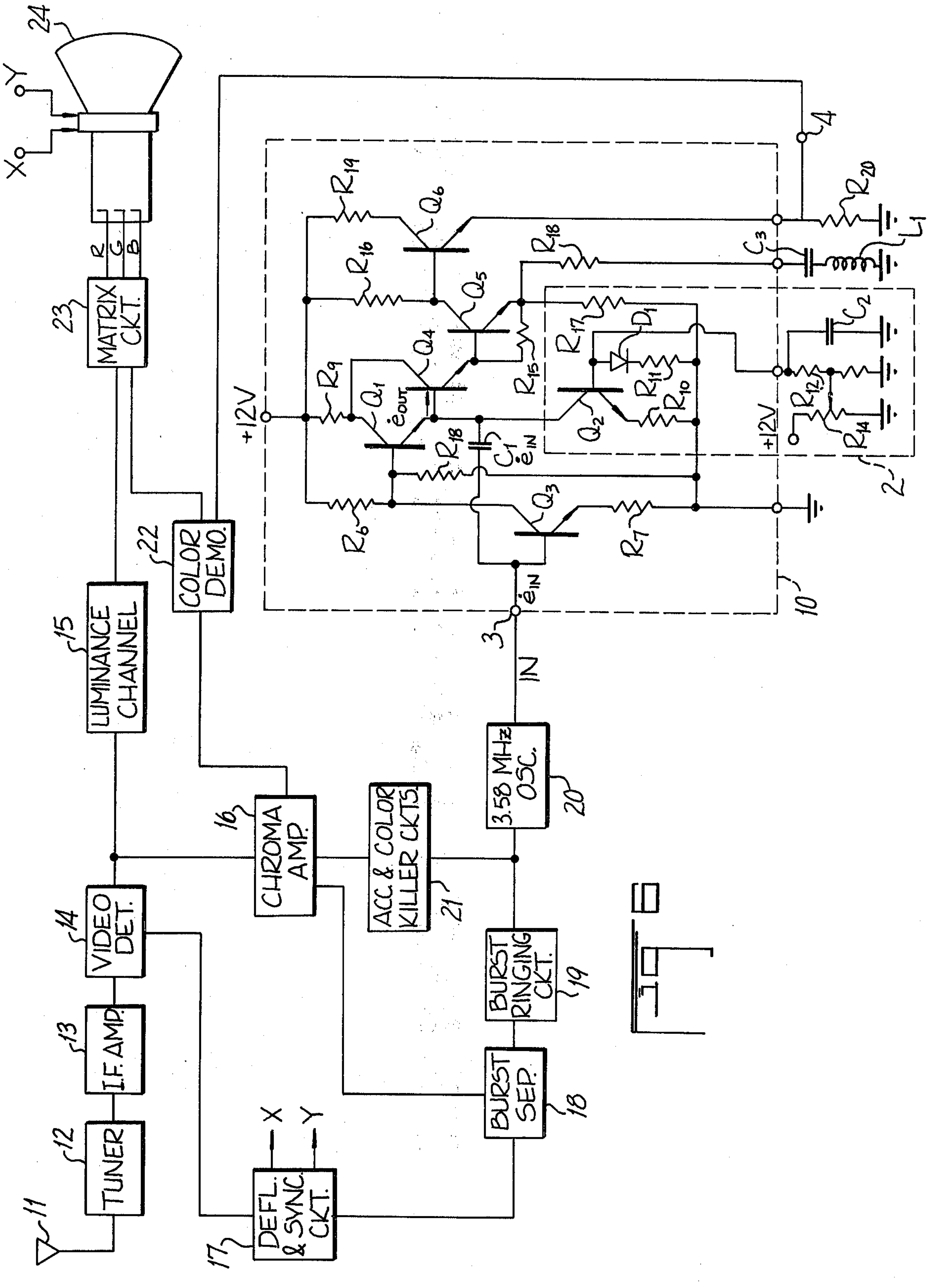
FIG. 6 is a schematic diagram showing the phase shifting circuit of FIG. 5 included in the chrominance channel of a color television receiver.

In a specific example of the phase shifting circuit shown on FIG. 5 in which the frequency of the input signal is approximately 3.58MHz., the various components thereof may have the following values:

$R_6 = 2.7K\Omega$
$R_7 = 2K\Omega$
$R_8 = 1.8K\Omega$
$R_9 = 200\Omega$
$R_{10} = 1K\Omega$
$R_{11} = 2K\Omega$
$R_{12} = 180K\Omega$
$R_{13} = 1.8K\Omega$
$R_{14} = 1.5K\Omega$
$R_{15} = 20K\Omega$
$R_{16} = 3.9K\Omega$
$R_{17} = 2K\Omega$
$R_{18} = 51\Omega$
$R_{19} = 200\Omega$
$R_{20} = 3.3K\Omega$
$C_1 = 10pF$
$C_2 = 0.01\mu F$
$C_3 = 390$ pF
$L_1 = 5.6\mu H$ Referring now to FIG. 6, it will be seen that the phase shifting circuit of FIG. 5 may be advantageously employed as a hue control circuit in a color television receiver. The illustrated color television receiver includes an antenna 11 and a tuner 12 for amplifying the RF signals received by antenna 11 and for converting the RF signals to IF signals which are amplified in an IF amplifier 13. A video detector circuit 14 is provided for obtaining composite television signals from the output of IF amplifier 13, and the luminance and chrominance components of such composite television signals are selected and amplified by a luminance channel 15 and a chroma amplifier 16, respectively. A deflection and synchronization circuit 17 separates synchronization signals from the composite signals selected by video detector 14 and produces line or horizontal and vertical deflection signals which are supplied to terminals X and Y of a color cathode ray tube 24. Circuit 17 further produces line gate signals which are supplied to a burst separator circuit 18 for controlling the gating of the latter by which color burst signals are separated from chrominance signals received by circuit 18 from chroma amplifier 16. A burst ringing circuit 19 converts the intermittent color burst signals received from burst separator 18 into continuous burst signals which are supplied to a carrier wave oscillator 20 having its 3.58MHz. output locked in frequency and phase to the continuous burst signals from burst ringing circuit 19. ACC (automatic chrominance control) and color killer circuits 21 detect the level of the continuous burst signals from circuit 19 and correspondingly control the gain of chroma amplifier 16, with the color killer circuit causing amplifier 16 to be ineffective, so that monochrome reproduction of the picture will result, when the level of the burst signals is below a predetermined value.

The phase shifting circuit 10 according to this invention receives the output of oscillator 20 at its input terminal 3 and provides a more or less phase shifted carrier signal at its output terminal 4 which is supplied to a color synchronous demodulator 22. The demodulator 22 demodulates color difference signals from the chrominance signals supplied by chroma amplifier 16 by means of the carrier signal from phase shifting circuit 10, and such color difference signals and luminance signals from channel 15 are combined in a matrix circuit 23 to produce color component signals R,G and B supplied to respective cathodes of color cathode ray tube 24. Thus, tube 24 reproduces a color picture with the hue thereof being dependent on the phase of the carrier signal received by color demodulator 22 from phase shifting circuit 10, and it will be apparent that the phase of such carrier signal can be shifted to change the hue of the reproduced color picture merely by manually adjusting the variable resistor $R_{14}$.

In a color television receiver as shown on FIG. 6, the phase shifting circuit according to this invention may be made as an integrated circuit on a respective semiconductor chip, or on a semiconductor chip or substrate which has other circuits also formed thereon, such as, the chroma amplifier 16, the burst separator circuit 18, the carrier signal oscillator 20, the ACC and color killer circuits 21 and the like.

Figure 7:
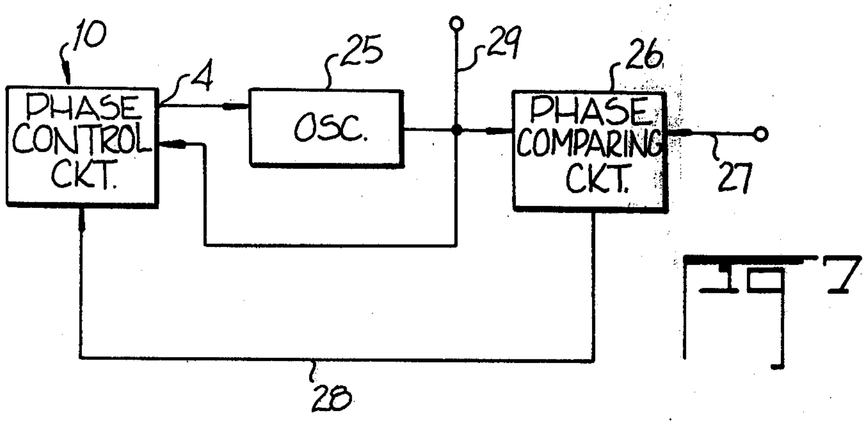
FIG. 7 is a schematic diagram illustrating another application of the phase shifting circuit according to this invention.

Referring now to FIG. 7, it will be seen that, in another application of the phase control circuit according to this invention, the input signal supplied to the terminal 3 of the phase shifting or control circuit 10 described above with reference to FIG. 5 is the output signal from an oscillator 25 which is locked in phase and frequency with the output signal obtained at terminal 4. The output signal from oscillator 25 is further supplied to a phase comparing circuit 26 along with a reference signal supplied to a terminal 27. The circuit 26 compares the phase of the output signal from oscillator 25 with the phase of the reference signal and produces a corresponding D.C. control signal which is applied through a lead 28 as a base bias to the base of transistor $Q_2$ on FIG. 5. Thus, in the application of the inventions illustrated by FIG. 7, the resistors $R_{12}$, $R_{13}$ and $R_{14}$ of FIG. 5, that is, the portion of the circuit for supplying a variable D.C. bias current to the base of transistor $Q_2$, may be omitted, and the base bias for that transistor is supplied by the control signal from phase comparing circuit 26. It will be apparent that, with the circuit arrangement shown on FIG. 7, the output from oscillator 25, as obtained at an output terminal 29, may be maintained in phase with the reference signal supplied to terminal 27.

Although a specific embodiment of this invention and various applications thereof have been described in detail herein with reference to the accompanying drawings, it is to be understood that the invention is not limited to that precise embodiment and the described applications thereof, and that various changes and modifications may be effected therein by one skilled in the art without departing from the scope or spirit of the invention as defined in the appended claims.

What is claimed is:

1. A phase shifting circuit comprising: a transistor having a base, emitter and collector; a capacitor connected with said transistor so as to form a series circuit with the base-emitter resistance of said transistor; signal supplying means for supplying first and second input signals of opposed polarity to the opposite ends of said series circuit; a power supply source having a pair of voltage terminals; means connecting said collector of the transistor with one of said voltage terminals; variable constant current source means connecting said emitter of the transistor with the other of said voltage terminals for controlling the emitter current of said transistor and thereby varying the emitter internal resistance, and hence said base-emitter resistance of the transistor; and a signal output terminal connected to said emitter for deriving therefrom an output signal with the phase of the latter being determined by the value of the constant current transmitted by said variable constant current source means.

2. A phase shifting circuit according to claim 1; in which said variable constant current source means includes a second transistor having a base, collector and emitter and being connected with the first mentioned transistor so that said emitter of said first transistor is connected to the said other voltage terminal of said power supply source through the collector-emitter path of said second transistor, and means for supplying a variable D.C. bias current to said base of said second transistor and thereby determining said value of the constant current.

3. A phase shifting circuit according to claim 2; in which said signal supplying means includes a third transistor having a base, collector and emitter, with said collector and emitter of said third transistor being respectively connected to said one voltage terminal and said other voltage terminal of said power supply source, a signal supply source for supplying said first input signal to the base of said third transistor and through said capacitor to said emitter of said first transistor, and means connecting the collector of said third transistor to said base of the first transistor.

4. A phase shifting circuit comprising: a transistor having base, emitter and collector electrodes; a power supply source having a pair of voltage terminals; signal supplying means for providing first and second input signals of opposed polarity; circuit means including a capacitor for applying said first input signal to said emitter electrode of the transistor through said capacitor; circuit means for applying said second input signal to said base electrode of the transistor; circuit means for connecting said collector electrode of the transistor to one of said voltage terminals; variable constant current source means connected between said emitter electrode of the transistor and the other of said voltage terminals; and a signal output terminal connected to said emitter electrode of the transistor.

5. A phase shifting circuit according to claim 4; in which said variable constant current source means includes a second transistor having base, emitter and collector electrodes with said emitter and collector electrodes of said second transistor being respectively connected to said other voltage terminal and to said emitter electrode of the first mentioned transistor, and variable D.C. voltage means connected to said base electrode of said second transistor.

6. A phase shifting circuit according to claim 5; in which at least said first and second transistors and said capacitor are formed as an integrated circuit on a single semiconductor chip.

7. A phase shifting circuit according to claim 5; in which said signal supplying means includes a signal source for supplying said first input signal, a third transistor functioning as a signal inverter and having base, emitter and collector electrodes, means connecting said signal source to said base electrode of the third transistor, and means connecting said collector and emitter electrodes of said third transistor with said voltage terminals, respectively, of the power supply source; and in which said circuit means for applying said second input signal to said base electrode of the first transistor is connected to said collector electrode of said third transistor.

8. A phase shifting circuit according to claim 5; in which said variable D.C. voltage means includes a variable resistor having a resistance element connected between said pair of voltage terminals and a movable tap, and means connecting said movable tap to said base electrode of the second transistor.

9. A phase shifting circuit according to claim 4; in which said signal supplying means includes a signal source for supplying said first input signal, another transistor functioning as a signal inverter and having base, emitter and collector electrodes, means connecting said signal source to the base electrode of said other transistor, and means connecting said collector and emitter electrodes of said other transistor with said voltage terminals, respectively; and in which said circuit means for applying said second input signal to said base electrode of the first mentioned transistor is connected to said collector electrode of said other transistor.

10. A phase shifting circuit according to claim 4; in which said variable constant current source means includes variable D.C. voltage means for determining the magnitude of the constant current transmitted therethrough.

* * * * *